United States Patent Office 3,331,127

Patented July 18, 1967

3,331,127

METHOD OF PRODUCING PRINTED CIRCUIT BOARDS

Horst Kerkhof, 181 Rotweg, Stuttgart-Zuffenhausen, Germany, and Herbert Leinauer, 34 Hirschbergstrasse, Asperg, Germany No Drawing. Filed Feb. 11, 1963, Ser. No. 257,756
Claims priority, application Germany, Feb. 15, 1962, St 18,862, St 18,863
12 Claims. (Cl. 29—625)

The present invention relates to an improved method of producing conductive patterns or circuits on insulating supports. It particularly relates to production of printed circuits generally comprising cleaning the support or board, applying a coat of conductive material over the surface of the support, printing a resist pattern on the coated support, etching away the non-printed portions of the conductive material, and providing recesses in appropriate places in the support for insertion and soldering of components wherein a protective coating is applied to the conductive material to prevent contamination or oxidation.

In manufacturing printed circuits into which components are subsequently inserted and soldered it is necessary at some stage of the manufacturing process to mechanically or chemically clean the surface of the conductive coating or plated metal on the insulating support in order to obtain satisfactory soldered joints during the subsequent soldering of the components into the printed circuit, e.g., by dip soldering. Since between the cleaning and the soldering steps the components must be inserted in the so-called printed circuit boards, the cleaned, oxide free, conductive surface must be protected against new oxidation and contamination by suitable protective means, e.g., application of a protective lacquer. This means or lacquer, however, must not affect the subsequent soldering step. For this reason some of the commercially available types of protective lacquers contain colophony or rosin.

These known protective lacquers have the following disadvantages:

(1) The colophony or rosin lacquer must be applied to the printed circuit boards when the boards are dry. Accordingly, a drying step is required between cleaning the boards and the application of the protective lacquer during which new oxidation of the conductive or copper surface may take place.

(2) The colophony lacquer is generally somewhat sticky. It can be applied only after the holes for receiving the components have been made, because otherwise the cutting tools become sticky and subsequent processing is rendered more difficult. Under certain circumstances damage may be caused to the tools. In view of the fact that the holes can be punched only in small individual boards, large boards having multiple printed circuits have to be cut into small boards before punching. Thus, a great number of small individual boards have to be handled in applying the lacquer. This method takes much time and is expensive.

It is therefore an object of the present invention to provide a protective material which is not sticky and may be applied to wet printed circuit boards.

One feature of the invention accordingly comprises applying a water soluble protective lacquer immediately after chemical or mechanical cleaning of the metal plated boards, or after the printing paint ordinarily used in producing printed circuit boards has been washed away.

The water soluble lacquer as employed in the specification and claims is intended to mean a lacquer which is actually soluble in water or which is at least compatible with water forming a suitable emulsion or colloidal suspension.

The protective lacquer may contain polyvinyl acetate as a binding agent and a pigment, such as a chromium compound, which increases the protection against corrosion. The lacquer suitably contains water and polyvinyl acetate in the proportions by weight of about 6 to 1 and, preferably, contains 86% by weight of water, 13.4% by weight of polyvinyl acetate and 0.6% by weight of pigment. The lacquer may be diluted by adding water, however, the ratio is preferably between about 5 to 1 and 30 to 1.

The process of the invention also has the following features and advantages:

(1) The lacquer may be applied to the wet boards as they come out of a chemical cleaning or rinsing bath. In this way new oxidation is avoided which is likely to occur between the cleaning step and application of the protective lacquer after a drying process. In addition, manufacturing time can be reduced. This is due to the fact that the boards, due to the water solubility of the lacquer, do not need to be dried after cleaning, but may be dipped into the lacquer while still wet immediately after cleansing or rinsing necessary for removing traces or remainders of acid ordinarily used during the cleaning process. The composition of the lacquer remains practically unchanged and the water solubility of the lacquer does not cause undesired chemical or physical reactions or processes having an effect upon the protective properties of the lacquer.

(2) Since the lacquer according to the invention is not sticky, it must be applied to the printed circuit boards prior to punching or inserting holes in the boards for the components. Application of the lacquer is most suitably carried out prior to printing of the series of individual circuit patterns or wiring patterns on the large boards. Handling of a great number of small individual boards is no longer required, neither during the cleaning step nor during the application of the lacquer. This results in a reduction of both working time and costs.

(3) Etching of the unprinted portion of the board performed subsequent to printing of the board is not affected by the protective lacquer used in according with the invention. Hence, although the binding agent of the lacquer is a synthetic or plastic material, etching of the boards coated with the lacquer may be carried out.

The protective lacquer does not need to be washed away prior to the soldering step. In fact, in this condition the printed circuit can be satisfactorily dip soldered because the lacquer is caused to melt due to the temperature of the soldering bath and thus the previously cleaned metal surface, preserved by the protective lacquer, is exposed to the solder.

It is also possible according to the process of the invention to use a well known commercially available water soluble lacquer in addition to such types of lacquers which contain polyvinyl acetate and a pigment. Such lacquers are known, for example, under the trade names "Irilac 1001" or "Irilac 1000." Up to the present time, however, these lacquers have not been used in the manufacture of printed circuits, but only generally for protecting surfaces against corrosion.

Furthermore, the present invention comprises a method of producing individual printed circuit boards by applying a layer of conductive material, e.g., copper, to the surface of a large support or board; cleaning the resulting coating; printing several individual wiring or circuit patterns simultaneously on the large board by applying a solderable printing paint; subsequently etching away the unprinted portion of the conductive material and separating the individual boards. The boards are provided with recesses and the usual components connected and assembled on the board.

In the manufacture of printed circuits the portions of the metal plated supporting material which are to remain after the etching process, that is, the circuit or wiring pattern, are printed or covered with an etch resistant or printing paint. It is known to use such paints which act as a soldering flux agent during the subsequent dip soldering step. These paints have the disadvantages of being very brittle and are prone to scaling during later drilling or punching of holes for the components on the printed circuit board. The previously cleaned metal surface of the wiring pattern which is free from oxides is accordingly exposed to the attack of substances producing dirt and corrosion just at those points at which satisfactory soldering is required.

These disadvantages may be avoided in producing large boards having multiple patterns by cutting the large board into smaller individual boards prior to printing. Holes are then provided in the individual boards and the boards are printed thereafter. This, in turn, however, has the disadvantage that a greater number of small units have to be handled, thus involving a greater investment in time and money than when handling and printing the large boards in the conventional manner in the uncut state.

The process of the invention provides a method which enables application of the solderable printing paint prior to cutting or processing of the multiple boards without the paint scaling subsequently during boring or stamping of perforations or impressions in the printed circuit board.

Another feature of the invention accordingly comprises application of the solderable printing paint in combination with the above protective water soluble lacquer.

Experience has shown that the use of the solderable printing paint in combination with the water soluble lacquer is necessary in order to achieve satisfactory adherence of the paint and to enable subsequent processing. If the solderable printing paint does scale off at some points during processing, protective lacquer which is applied underneath the printing paint will prevent detrimental corrosion of the metal of the wiring pattern.

Thus, according to a further embodiment of the invention, the water soluble lacquer may be applied immediately after chemical or mechanical cleaning of the metallized boards and the solderable printing paint applied subsequently.

The solderable printing paint which is used in accordance with the method of the invention adheres well to the protective lacquer coating and is not subject to the above disadvantages. The resulting boards are easily soldered. The so-called multiple boards produced in this manner eliminate a number of steps of the process, as well as processing or handling of small size boards.

The process of the invention is further illustrated by the following examples. Example 1 is a conventional method employed heretofore and Examples 2 and 3 embody the process of the invention.

EXAMPLE 1

*(Known method)*

The following steps of the known process are necessary:

(1) Cleaning of the metal plated board prior to the printing (this step is necessary in order to ensure a sufficient adhesion of the printing paint).

(2) Printing (e.g., in accordance with the offset or screen printing method) simultaneously several patterns on the metal plated board of insulating material (multiple board).

(3) Air or oven drying of the printing paint.

(4) Etching (etching away of the non-printed portions).

(5) Washing away of the printing paint with the aid of paint removing agents.

(6) Cutting of the multiple boards into the desired number of small individual boards.

(7) Perforation of the small individual boards by punching or boring.

(8) Mechanical or chemical cleaning of the small individual boards (necessitated by the previous mechanical or manual handling).

(9) Drying, e.g., oven drying of the small individual boards, causing formation of oxides. Every one of the many small individual boards is handled manually.

(10) Fluxing (coating with colophony protective lacquer).

(11) Oven drying.

(12) Positioning of components.

(13) Coating with fluxing agent (the connecting wires of the components are often insufficiently tinned).

(14) Dip soldering of the resulting board.

EXAMPLE 2

*(Inventive method A)*

The following steps were carried out:

(1) Chemical cleaning of the surface of a metal plated large multiple board and preserving of the resulting clean surface by applying a lacquer according to the process of the invention.

(2) Printing of the wiring pattern.

(3) Air or oven drying of the printing paint.

(4) Etching.

(5) Washing away of the printing paint from the multiple board provided with the coating of protective lacquer.

(6) Cutting of the multiple board into small individual boards.

(7) Perforation of the small individual boards.

(8) Positioning of components.

(9) Application of the flux agent.

(10) Dip soldering.

As can be seen, no less than four steps of the process employed heretofore can be saved when applying the method according to the invention, e.g., process steps 8, 9, 10 and 11 in Example 1.

In cases where a paint removing agent is used for removing the printing paint, which attacks the protective lacquer, it is more advantageous to apply the protective lacquer after the printing paint has been washed away instead of applying the lacquer during the first step of the process (Example 2), i.e., between the fifth and sixth steps. The steps of this process, however, are still simpler than those used heretofore and the advantage of applying the lacquer prior to cutting of the multiple board is still present.

The protective lacquer used in Example 2 contained polyvinyl acetate as a binding agent and chromium compounds as the pigment. The solvent was water. These were mixed in the ratio by weight of about 13.4% polyvinyl acetate, 86% water and 0.6% pigment. The lacquer was diluted by adding water in the ratio of between about 1:5 and 1:20, proportions of 1:5 or 1:15 being preferred. The protective lacquer may also contain sulphate of ammonia of a vinyl acetate copolymer. Equally good results are obtainable in cases where the pigment contains one or more additives of Cr, Na, Cu, Ca, Sr or Mg besides a chromium compound. Instead of the pigment other substances which prevent corrosion may also be added.

EXAMPLE 3

*(Inventive method B)*

The following steps were carried out:

(1) Chemical or mechanical cleaning of a metal plated board and preservation of the surface by applying a water soluble protective lacquer according to the invention.

(2) Simultaneous printing of several wiring patterns arranged adjacent each other upon a large multiple board with the aid of a solderable printing paint.

(3) Air or oven drying of the printing paint.

(4) Etching.

(5) Cutting of the multiple board into small individual boards.

(6) Boring or punching the necessary holes into the small individual boards.

(7) Positioning of the components.

(8) Application of the soldering flux agent.

(9) Dip soldering.

As can be seen, no less than five different steps of the method are omitted from the process of Example 1, i.e., the steps 5, 8, 9, 10 and 11 in Example 1.

Although the protective lacquer employed is a synthetic resin lacquer, the surprising result is that it not only can be etched and also permits soldering of the circuit covered thereby, but, finally, provides the solderable printing paint with those properties which are necessary to enable satisfactory subsequent processing and punching, boring or provision of other types of recesses without having a disadvantageous effect upon this processing.

What we claim is:

1. A process for producing a series of individual printed circuits on an insulating base comprising the steps of coating said base with a conductive material subject to corrosion and contamination, applying thereto a layer of water soluble protective lacquer, printing said series of individual circuits on the resulting coating with a printing paint and removing the unprinted portions of the coating by etching.

2. A process as in claim 1 wherein the protective lacquer contains polyvinyl acetate.

3. A process as in claim 1 wherein the protective lacquer contains a salt of ammonia and a vinyl acetate copolymer.

4. A process as in claim 1 wherein the protective lacquer contains a pigment and a corrosion resistant agent.

5. A process as in claim 1 wherein the protective lacquer contains a pigment and an element selected from the group consisting of Cr, Na, Cu, Ca, Sr and Mg.

6. A process as in claim 1 wherein the protective lacquer contains water and polyvinyl acetate in the ratio by weight of at least 1:1.

7. A process as in claim 1 wherein the protective lacquer contains polyvinyl acetate and water in the ratio by weight of 1:5 to 1:30.

8. A process as in claim 1 wherein the protective lacquer consists essentially of about 86% by weight water, 13.4% by weight polyvinyl acetate and 0.6% by weight pigment.

9. A process for producing a series of individual printed circuits on an insulating base comprising the steps, respectively, of coating said base with a conductive material subject to corrosion and contamination; printing said series of individual circuits on the resulting coating with printing paint and removing the unprinted portions of the coating by etching; washing away the printing paint; applying to the resulting exposed circuits on the base a coating of a water soluble protective lacquer; and separating the series of circuits into its individual members.

10. A process of producing a series of individual circuits on an insulating base comprising the steps of coating said base with a conductive material subject to corrosion and contamination; in combination, cleaning the resulting coating and applying thereto a coating of a water soluble protective lacquer; printing said series of individual circuits on the resulting coating, and removing the unprinted portions of the conductive material by etching.

11. A process for producing a series of individual printed circuits on an insulating base comprising the steps of coating said base with a conductive material subject to corrosion and contamination; cleaning the resulting coating; in combination, printing said series of individual circuits on the resulting coating with a solderable printing paint and applying thereto a coating of protective water soluble lacquer; removing the unprinted portions of the conductive material by etching.

12. A process for producing a series of individual printed circuits on an insulating base comprising, respectively, the steps of coating said base with a conductive metal; chemically cleaning the resulting metal coating and applying thereto a coat of water soluble protective lacquer containing polyvinyl acetate; printing the series of individual circuits on the resulting coated base with a printing paint; drying the paint and removing the unprinted portion of the coatings by etching; separating the individual circuits of the series; providing recesses and holes in the individual circuits for components; positioning components in the recesses and holes; applying a flux agent to the resulting circuits and dip soldering the circuits and components.

References Cited

UNITED STATES PATENTS

| | | | |
|---|---|---|---|
| 2,611,040 | 9/1952 | Brunetti | 29—155 |
| 2,762,113 | 9/1956 | Daniels et al. | 29—155.5 |
| 2,777,192 | 1/1957 | Albright et al. | 29—155.5 |
| 2,851,380 | 9/1958 | Berlinghof. | |
| 2,905,539 | 9/1959 | Bowerman | 29—155.5 XR |
| 3,052,957 | 9/1962 | Swanson | 29—487 XR |
| 3,097,418 | 7/1963 | Valliere | 29—155.5 |

FOREIGN PATENTS

| | | |
|---|---|---|
| 869,295 | 5/1957 | Great Britain. |

OTHER REFERENCES

The Condensed Chemical Dictionary, 6th ed., Reinhold Publishing Corp., 1961.

JOHN F. CAMPBELL, *Primary Examiner.*

P. M. COHEN, *Assistant Examiner.*